United States Patent [19]
Utsugi

[11] Patent Number: 5,973,973
[45] Date of Patent: Oct. 26, 1999

[54] SEMICONDUCTOR MEMORY DEVICE

[75] Inventor: Satoshi Utsugi, Tokyo, Japan

[73] Assignee: NEC Corporation, Tokyo, Japan

[21] Appl. No.: 09/179,891

[22] Filed: Oct. 28, 1998

[30]         Foreign Application Priority Data

Oct. 30, 1997  [JP]   Japan ................................. 9-298922

[51] Int. Cl.[6] ................................ G11C 7/00; G11C 8/00
[52] U.S. Cl. ..................... 365/205; 365/190; 365/230.03
[58] Field of Search ................................... 365/190, 205,
                                                    365/207, 208, 230.03

[56]                References Cited

U.S. PATENT DOCUMENTS

| 5,570,319 | 10/1996 | Santoro et al. | 365/230.03 |
| 5,623,442 | 4/1997 | Gotou et al. | 365/185.08 |
| 5,724,292 | 3/1998 | Wada | 365/207 |

FOREIGN PATENT DOCUMENTS 5-47179   2/1993   Japan .

*Primary Examiner*—David Nelms
*Assistant Examiner*—Anh Phung
*Attorney, Agent, or Firm*—Sughrue, Mion, Zinn, Macpeak & Seas, PLLC

[57]                    ABSTRACT

In order to achieve a speed up of threshold value correcting operation and read operation of level detecting transistors of a semiconductor memory device and a reduction of an area of a chip thereof, a sense amplifier SA10 includes a threshold value correction driving transistor Q16 responsive to a threshold value correction drive signal RSB1 to correct levels of bit lines of data lines DL11 and DL12 with respect to threshold values of level detecting transistors Q11 and Q21 during a precharge period T2 and a read driving transistor Q15 responsive to a read control signal RS1 to activate the transistors Q11 and Q21 such that the latter transistors detect the levels of the bit lines of the data lines DL11 and DL12 during a read period T3.

2 Claims, 7 Drawing Sheets

SEMICONDUCTOR MEMORY DEVICE

BACKGROUND OF THE INVENTION

1. Field of the Invention

The present invention relates to a semiconductor memory device and, particularly, to a semiconductor memory device in which variations of threshold voltages of transistors constituting sense amplifiers thereof are compensated for.

2. Description of the Related Art

In a large capacity semiconductor memory device such as DRAM, etc., load capacitances of bit lines connected to sense amplifiers are increased with the recent further increase of memory capacity thereof. Such increase of the load capacitances cause an operating speed of the semiconductor memory device to be reduced. In order to solve such problem, it is usual to divide a memory cell array to a plurality of sub memory arrays to thereby reduce load capacitances of bit lines of the respective sub memory arrays, that is, sub bit lines.

On the other hand, each sense amplifier includes transistors for detecting potential levels of the sub bit lines. Necessarily, there are variations of threshold voltages of such level detecting transistors. A difference in threshold voltage between the level detecting transistors becomes a source of reduction of S/N and reduction of sensitivity since the threshold voltage difference becomes an offset voltage of the sense amplifier. Further, the variation of threshold voltage tends to increase with the increasing fineness of transistor.

On the other hand, a chip area of the semiconductor memory device has becomes about 1.5 times every generation. Although an area of memory cells can be reduced by utilizing the three dimensional structure such as trench structure and stack structure, the ratio of area occupied by the sense amplifiers to the chip area of the semiconductor memory device is increasing since the sense amplifier must use a flat structure.

Therefore, in order to realize a DRAM of giga-bit class, it is important to form high precision sense amplifiers having small area by compensating for variation of threshold voltages of the level detecting transistors constituting the sense amplifiers.

A conventional semiconductor memory device in which such variation of the threshold voltage is compensated for will be described with reference to FIG. 5 which is disclosed in Japanese Patent Application Laid-open No. Hei 5-47179. In the conventional semiconductor memory device 300 shown in FIG. 5, sense amplifiers connected to sub bit line pairs of respective sub memory cell arrays are of the direct sense system and are constructed with only NMOS transistors and bit line pairs of the respective memory cell arrays and a pair of common bit lines are formed in respective layers to form a hierarchical bit line construction.

The semiconductor memory device 300 shown in FIG. 5 comprises a memory cell array MA10 including a bit line pair (referred to as BL1, hereinafter) composed of complimentary bit lines BL11 and BL12 which are formed in parallel to each other with a small gap therebetween and a plurality of memory cells C11, C12 connected to the respective bit lines BL11 and BL12 and functioning to write data on the bit line corresponding to selected one of the memory cells C11, C12 and read the data stored in the selected memory cell onto the corresponding bit line, a memory cell array MA20 including a bit line pair BL2 composed of complimentary bit lines BL21 and BL22, memory cells C21, C22 and bit lines having the same construction and function as those of the memory cell array MA10 and arranged in registration with the respective bit lines BL11 and BL12 of the memory cell array MA10, a plurality of word lines WL11, WL12, WL21, WL22, for selecting predetermined memory cells of the memory cells included in the memory cell arrays MA10, MA20, precharge circuits PC10 and PC20 for precharging the bit line pairs BL1 and BL2 of the memory cell arrays MA10, MA20 to a precharge voltage VH which is a half of a power source voltage VD with a predetermined timing according to a precharge control signal PCS1, paired common bit lines GBL1 and GBL2 provided for the respective corresponding bit lines BL11, BL12, BL21 and BL22 of the memory cell arrays MA10, MA20, a sense amplifier SA10 for transmitting voltage levels of the bit lines BL11 and BL12 to the common bit lines GBL2 and GBL1, respectively, during a read operation and transmitting voltage levels of the common bit lines GBL1 and GBL2 to the bit lines BL11 and BL12, respectively, during a read operation and a sense amplifier SA20 constructed similarly to the sense amplifier SA10 for transmitting voltage levels of the bit lines BL21 and BL22 to the common bit lines GBL2 and GBL1, respectively, during the read operation and transmitting voltage levels of the common bit lines GBL1 and GBL2 to the bit lines BL21 and BL22, respectively, during the write operation.

The sense amplifier SA10 is composed of voltage level detecting NMOS transistors Q11 and Q21 having sources supplied with an output voltage OCV1 of a threshold voltage correcting driver circuit and gates connected to the respective bit lines BL11 and BL12, threshold voltage correcting NMOS transistors Q12 and Q22 having gates supplied with a threshold voltage correction control signal CVT1, sources connected to drains of the respective transistors Q1 and Q21 and drains connected to the respective bit lines BL11 and BL12, read NMOS transistors Q12 and Q23 having gates supplied with a read control signal RS1, ones of source drains connected to the drains of the respective transistors Q11 and Q21 and the others of the source drains connected to the respective common bit lines GBL2 and GBL1 and write transistors Q14 and Q24 having gates supplied with a write control signal WS1, ones of source drains connected to the respective common bit lines GBL1 and GBL2 and the others of the source drains connected to the respective bit lines BL11 and BL12.

Now, an operation of the semiconductor memory device 300 shown in FIG. 5 will be described with reference to a timing chart shown in FIG. 6. As shown in FIG. 6, one cycle of the operation of the semiconductor memory device 300 can be roughly divided to a precharge period T1, a threshold value correcting period T2, a read period T3 and a re-write period T4.

In the precharge period T1, the precharge circuit PC10 responds to an active level of the precharge control signal PCS1 to precharge the bit lines BL11 and BL12 to the precharge voltage VH which is a half of the power source voltage VD.

Then, in the threshold voltage correcting period T2, the precharge control signal PCS is made inactive to make the precharge circuit PC10 inactive and, simultaneously, a threshold voltage correction control signal CVT1 is set to H level. In response to the change of the threshold voltage correction control signal CVT1 to the H level, the transistors Q12 and Q22 of the sense amplifier SA10 are turned on to diode-connect the transistors Q11 and Q21. Simultaneously therewith, a reference correction voltage OCV1 is set to a correction level to correct voltage levels of the bit lines BL11 and BL12 to voltages corresponding to the threshold voltages of the respective transistors Q11 and Q21.

In the read period T3 subsequent to this threshold voltage correction, one of the word lines, for example, the word line WL11, is set to a selection level and a data stored on a memory cell C11 is read out to the bit line BL11. Simultaneously, the threshold voltage correction control signal OCV1 is set to a reference level. The transistors Q11 and Q21 of the sense amplifier SA10 respond to the setting of the threshold voltage correction control signal OCV1 to the reference level to sense the levels of the respective bit lines BL11 and BL12.

Thereafter, a read control signal RS1 is set to an active level. In response to the setting of the read control signal RS1 to the active level, the transistors Q13 and Q23 of the sense amplifier SA10 are turned on and transmit the levels of the bit lines BL11 and BL12 detected by the detecting transistors Q11 and Q21 to the respective common bit lines GBL1 and GBL2. A common sense amplifier GSA amplifies a potential difference between the common bit lines GBL1 and GBL2 up to a full amplitude and outputs it externally.

Then, in the re-write period T4, a write control signal WS1 is made active. In response to the activation of the write control signal WS1, the transistors Q14 and Q24 of the sense amplifier SA10 are turned on, so that the fully amplified voltage levels on the common bit lines GBL1 and GBL2 are transmitted to the respective bit lines BL11 and BL12 and re-written in the memory cell C11 selected by the word line WL11.

In this semiconductor memory device 300, the voltage levels of the bit lines BL11 and BL12 are corrected according to the threshold voltages of the detecting transistors Q11 and Q12 before the data stored in the memory cell is read out. Therefore, it is possible to maximize the magnitude of voltage level variation of the bit lines with respect to the threshold voltages of the transistors Q11 and Q12 at the time when data stored in the memory cells C11 and C12, etc., are read out and thus the problem of reduction of S/N and sensitivity is solved.

Further, as mentioned previously, since the bit lines BL11, BL12, BL21 and BL22 are formed in the layer other than the layer in which the common bit lines GBL1 and GBL2 are formed and the sense amplifiers SA10 and SA20 are constructed with NOM type transistors only, it is possible to reduce an occupation area thereof.

FIG. 7 is a circuit diagram of an example of the threshold voltage correction/read operation driver circuit OCD. In FIG. 7, the driver circuit OCD comprises an NMOS transistor Q9 having commonly connected gate and drain supplied with a boosting level VXD, an NMOS transistor Q10 having a drain connected to a source of the transistor Q9, a source connected to ground potential and a gate supplied with the control signal RS1, an NMOS transistor Q7 having a drain supplied with a threshold value correcting voltage OVV, a gate connected to the source of the transistor Q9 and a source from which the driver output voltage OCV1 and an NMOS transistor Q8 having a drain connected to the source of the transistor Q7, a source connected to ground potential and a gate supplied with the control signal RS1.

An operation of the driver circuit OCD will be described with reference to FIG. 7. For the threshold voltage correcting operation, the read operation control signal RS1 is set to an active level. In response to the read operation control signal RS1 in the active level, the transistor Q10 is turned off to thereby set a potential of the gate of the transistor Q7 to H level. In response to the level change of the gate potential to H level, the transistor Q7 is turned on to make the driver output voltage OCV1 to the threshold value correction voltage OVV.

For the read operation, the read operation control signal RS1 is set to active level to turn the transistor Q10 on. Thus, the gate of the transistor Q7 is supplied with a level determined by a ratio of size, that is, current drive ability, between the transistors Q9 and Q10. Since the current drive ability of the transistor Q10 is set higher than that of the transistor Q9, the transistors Q7 and Q8 are turned off and on, respectively, when the read control signal RS1 is in the active level, and so the driver output voltage OCV1 becomes ground potential.

Since, in this driver circuit, the output current is substantially restricted by the current drivabilities of the transistors Q7 and Q8 in the output stage, there is a problem that the threshold value correction and the read operation take considerable times, respectively, and the speed-up of the data access is difficult. Assuming the division number of the memory cells in the conventional semiconductor memory device 300 described above is, for example, 256, 256 sense amplifiers commonly use one threshold correction/read operation driver OCD. Since, as mentioned above, the output current of this driver circuit is substantially restricted by the current drivabilities of the output stage transistors, there is the problem that the threshold voltage correction and the read operation take considerable times, respectively, and the speed-up of the data access is difficult.

Further, since the current flows through the series connected transistors Q9 and Q10 of the output drive stage during the read operation period, reduction of current consumption of the chip is difficult.

SUMMARY OF THE INVENTION

An object of the present invention is to provide a semiconductor memory device having small chip area and allowing a speed-up of the threshold voltage correction and the read operation of the level detecting transistors.

According to the present invention, a semiconductor memory device comprises a memory cell array, the memory cell array being divided to a plurality of sub memory cell arrays each including a predetermined number of memory cells, a plurality of sub bit line pairs each composed of complimentary first and second bit lines corresponding to each sub memory cell array, a common sense amplifier compatible with a plurality of sense amplifiers each including level detecting transistors for detecting levels of the first and second bit lines and a common bit line pair composed of complimentary first and second common bit lines, and each sense amplifier comprises a threshold voltage correction driver responsive to a threshold value correction drive signal to correct the levels of the first and second bit lines with respect to the threshold values of the level detecting transistors during a precharge period and a read driver responsive to a read control signal to operate the level detecting transistors such that the level detecting transistors detect the levels of the first and second bit lines during a read period.

BRIEF DESCRIPTION OF THE DRAWINGS

The above mentioned and other objects, features and advantages of the present invention will become more apparent by reference to the following detailed description of the invention taken in conjunction with the accompanying drawings, wherein.

DETAILED DESCRIPTION OF THE PREFERRED EMBODIMENTS

Figure 1:
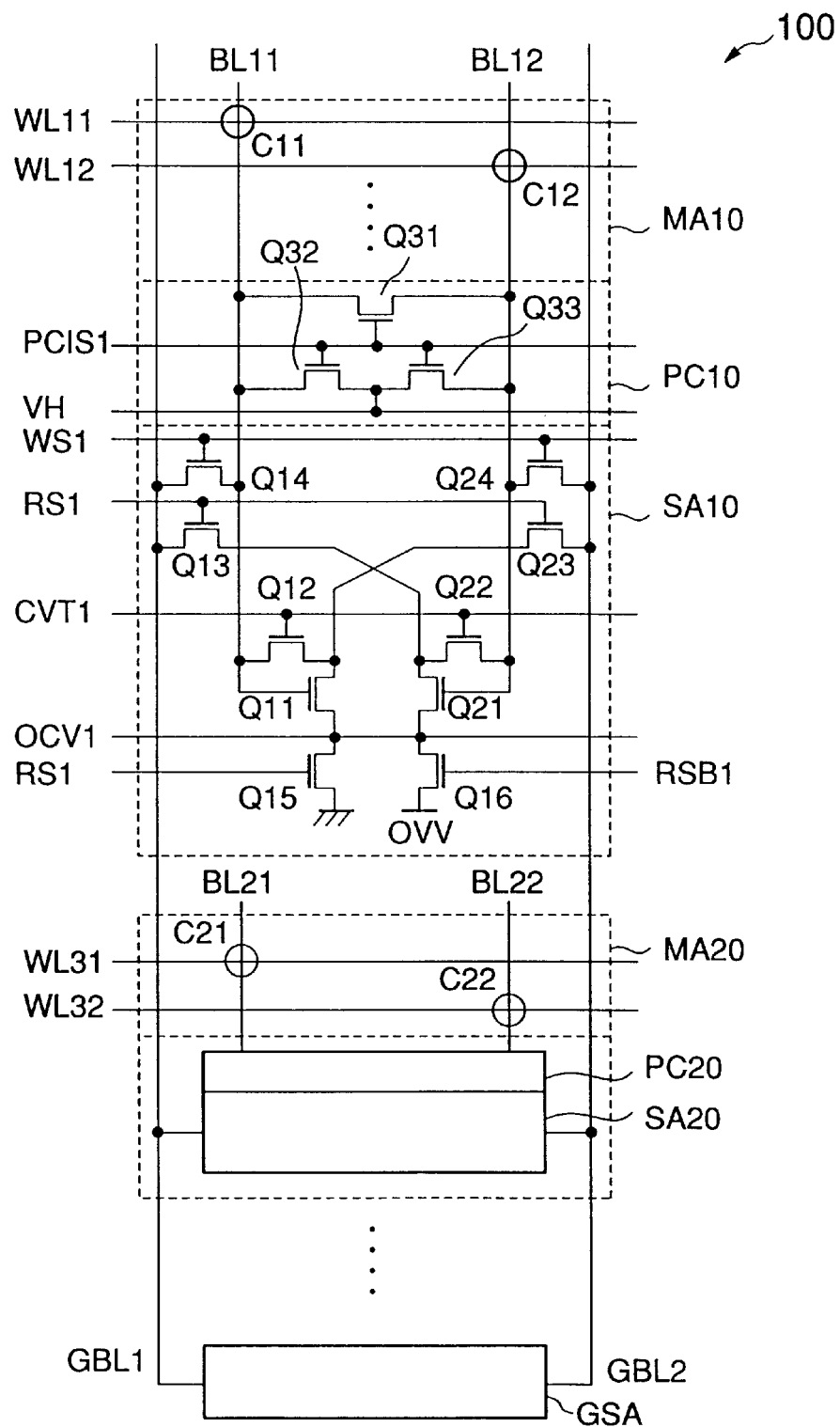
FIG. 1 is a circuit diagram showing a semiconductor memory device 100 according to a first embodiment of the present invention.

A semiconductor memory device 100 according to a first embodiment of the present invention will be described with reference to FIG. 1.

The semiconductor memory device 100 is integrated in a semiconductor chip. The semiconductor memory device 100 comprises common bit lines GBL1 and GBL2 which are paired and formed in a first layer in partle to each other with a small gap therebetween and a common sense amplifier GSA connected between the common bit lines GBL1 and GBL2. A signal amplified by the common sense amplifier GSA is output externally of the chip through an output circuit which is not shown.

A plurality of memory cell arrays MA10, MA20, are connected to the common bit lines GBL1 and GBL2. Precharge circuits PC10, PC20, and sense amplifiers SA10, SA20, are provided correspondingly to the memory cell arrays MA10, MA20, respectively.

The precharge circuit PC10 responds to a precharge control signal PCS1 to precharge corresponding paired bit lines BL1 and BL2 to a precharge voltage VH which is one half of a power source voltage VD. Similarly, the precharge circuit PC20 responds to a precharge control signal PCS2 which is not shown to precharge corresponding paired bit lines BL21 and BL22 to the precharge voltage VH, respectively.

Now, a construction of the precharge circuit PC10 will be described in detail. The precharge circuit PC10 comprises a transistor Q31 for short-circuiting the bit lines BL11 and BL12 in response to the precharge control signal PCS1, a transistor Q32 for supplying the precharge voltage VH to the bit line BL11 in response to the precharge control signal PCS1 and a transistor Q33 for supplying the precharge voltage VH to the bit line BL12 in response to the precharge control signal PCS1. It should be noted that the precharge circuit PC20 has the same construction.

The sense amplifier SA10 is connected to the paired bit lines BL11 and BL12, detects a potential difference between the bit lines BL11 and BL12 by detecting transistors Q11 and Q21 and amplifies the potential difference. In response to a read control signal RS1, the amplified potential difference is transmitted to the common bit lines GBL2 and GBL1, respectively, and further amplified by the common sense amplifier GSA. The potential difference which is further amplified by the common sense amplifier GSA is returned to the paired bit lines BL11 and BL12 in response to a write control signal WS1 and re-written therein. Similarly, the sense amplifier SA20 is connected to the paired bit lines BL21 and BL22, detects a potential difference between the bit lines BL21 and BL22 and amplifies the potential difference. In response to a read control signal RS1, the amplified potential difference is transmitted to the common bit lines GBL2 and GBL1, respectively, in response to a read control signal RS2 which is not shown and further amplified by the common sense amplifier GSA. The potential difference which is further amplified by the common sense amplifier GSA is returned to the paired bit lines BL21 and BL22 in response to a write control signal WS2 which is not shown and re-written therein.

The sense amplifier SA10 includes a mechanism for compensating for a difference between a threshold value of the detecting transistor Q11 and a threshold value of the detecting transistor Q21. Necessarily, the sense amplifier SA20 includes a similar mechanism.

A construction of the sense amplifier SA10 will be described in detail. The sense amplifier SA10 is composed of the detecting transistor Q11 for detecting a potential of the bit line BL11, the detecting transistor Q12 for short-circuiting a gate of the detecting transistor Q11 to a drain (source) thereof in response to a threshold value correction control signal CVT1, the detecting transistor Q22 for short-circuiting a gate of the detecting transistor Q21 to a drain (source) thereof in response to the threshold value correction control signal CVT1, a transistor Q23 for connecting the drain (source) of the detecting transistor Q11 to a common bit line GBL2 in response to the read control signal RS1, a transistor Q13 for connecting the drain (source) of the detecting transistor Q21 to a common bit line GBL1 in response to the read control signal RS1, a transistor Q14 for connecting the common bit line GBL1 to the bit line BL11 in response to the write control signal WS1 and a transistor Q24 for connecting the common bit line GBL2 to the bit line BL12 in response to the write control signal WS1. The sense amplifier SA10 further includes a transistor Q15 connected between the sources (drains) of the detecting transistors Q11 and Q21 and ground and a transistor Q16 connected between the sources (drains) of the detecting transistors Q11 and Q21 and a threshold value correction voltage OVV. The transistor Q15 becomes conductive in response to the read control signal RS1 and the transistor Q16 becomes conductive in response to a threshold value correction drive signal RSB1 which is an inversion of the read control signal RS1. Although not shown, the sense amplifier SA20 has a similar construction. The respective memory cell arrays MA10, MA20, include a number of dynamic memory cells C11, C12, C21, C22. The respective memory cells are arranged at cross points of word lines WL11, WL12, WL31, WL32, and bit lines BL11, BL12, BL21, BL22, respectively, as shown in FIG. 1 and each memory cell is constructed with 1 transistor and 1 capacitor (1tr1c).

All of the memory cell arrays MA10, MA20, the precharge circuits PC10, PC20, and the sense amplifiers SA10, SA20, are constructed with N channel MOS transistors.

Now, an operation of the semiconductor memory device 100 will be described with reference to a time chart shown in FIG. 2. As in the conventional semiconductor memory device 300, the operation of the semiconductor memory device 300 for one cycle can be roughly divided to a precharge period T1, a threshold value correcting period T2, a read period T3 and a re-write period T4.

In the precharge period T1, the precharge signal PCS is set to an inactive level by the precharge circuits PC10 and PC20 to precharge the bit lines BL11, BL12, BL21 and BL22 to the precharge voltage VH.

In the following description, the operation of the semiconductor memory device 100 related to the memory cell array MA10, the precharge circuit PC10 and the sense amplifier SA10 will be described for convenience of description unless otherwise defined.

Then, in the threshold value correcting period T2, the precharge control signal PCS1 is made inactive to make the precharge circuit PC10 inactive and, then, a threshold value correction control signal CVT1 is set to an active level. In response to the change of the threshold value correction control signal CVT1 to the active level, the transistors Q12 and Q22 are turned on to diode-connect the transistors Q11 and Q21.

On the other hand, the threshold value correction drive signal RSB1 is a H level. In response to the H level of the threshold value correction drive signal RSB1, the transistor Q16 of the sense amplifier SA10 is turned on and supplies the threshold value correction voltage OVV to the sources of the transistors Q11 and Q21. Thus, levels of data lines DL11 and DL12 are corrected to values corresponding to the threshold values of the respective transistors Q11 and Q12.

That is, the gate potential of the detecting transistor Q11, that is, the potential of the bit line BL11, is set to a value higher than the threshold value correction voltage OCV by the threshold voltage of the detecting transistor Q11 and the gate potential of the detecting transistor Q21, that is, the potential of the bit line BL21, is set to a value higher than the threshold value correction voltage OCV by the threshold voltage of the detecting transistor Q21.

Therefore, if, for example, the threshold voltage of the detecting transistor Q11 is higher than the threshold voltage of the detecting transistor Q21, the potential of the bit line BL11 becomes higher than the potential of the bit line BL12. This means that a reduction of current flow due to high threshold voltage of the detecting transistor Q11 is cancelled by increasing the gate potential of the detecting transistor Q11 and, therefore, the same currents can flow through the detecting transistors Q11 and Q21. Assuming that the memory cell C11, for example, is selected and an information stored therein appears on the bit line BL11, different currents corresponding to this signal difference can flow through the detecting transistors Q11 and Q12. This current difference cancels the threshold voltage difference between the detecting transistors Q11 and Q21 as mentioned above. Since the variation of the threshold values of the detecting transistors Q11 and Q21 are compensated for in this manner, a precise sense operation becomes possible.

Figure 2:
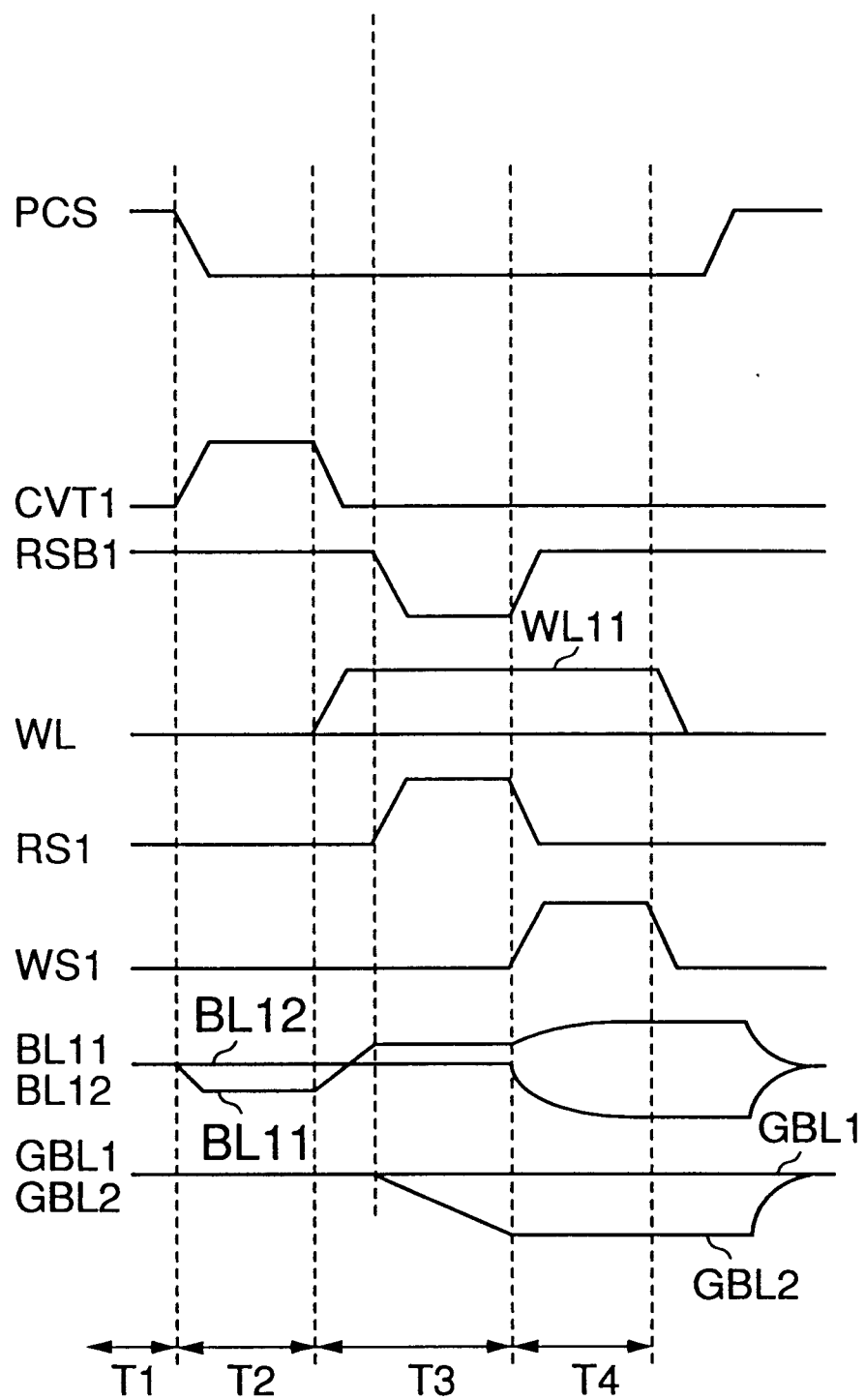
FIG. 2 is a time chart useful in understanding an operation of the semiconductor memory device 100.

The potential difference between the bit lines BL11 and BL12 in the threshold value correction period T2 shown in FIG. 2 results from the above mentioned threshold regulation operation.

In this case, the threshold value correction voltage OCV is supplied to not a number of sense amplifiers through the common driver OCD as in the case of the conventional semiconductor memory device 300 but the respective sense amplifiers through the transistors Q16 thereof. Therefore, the threshold value correction voltage OCV is smoothly supplied to the sources of the level detecting transistors Q11 and Q21.

In the read period T3, the threshold value correction control signal CVT1 is set to an inactive level. Therefore, the transistors Q12 and Q22 are turned off and the diode-connection of the transistors Q12 and Q22 is broken.

Further, one of the plurality of word lines, in this embodiment, the word line WL11 is made a selection level to select the memory cell C11 of one of the memory cell arrays, the memory cell array MA1, and the information held in the memory cell C11 is read out on the bit line BL11.

Thereafter, the read control signal RS1 is made active level and, in response thereto, the transistor Q15 of the sense amplifier SA10 is turned on. Thus, the detecting transistors Q11 and Q21 start the level detections of the bit lines BL11 and BL12, respectively. That is, the common bit lines GBL1 and GBL2 are discharged in response to the potential difference between the bit lines BL11 and BL12.

In this case, the ground potential is applied to the sources of the level detecting transistors Q11 and Q21 not through the common driver OCD which is common for a number of the sense amplifiers as in the case of the conventional semiconductor memory device 300 but through the transistors Q15 of the respective sense amplifiers. Therefore, the sources of the level detecting transistors Q11 and Q21 becomes the ground potential rapidly.

In this manner, the potential difference between the bit lines BL11 and BL12 is transmitted to the common bit lines GBL1 and GBL2.

Further, the common sense amplifier GSA amplifies the potential difference between the common bit lines GBL1 and GBL2 up to the full amplitude and output externally.

In the read period T3, the fact that the potential of the bit line BL2 is unchanged while the potential of the bit line BL1 is increased results from the fact that the word line WL11 is selected and the information held in the memory cell C11 is read out onto the bit line BL11.

Then, in the re-write period T4, the read control signal RS1 is made active to cut the transistors Q13 and Q23 off. When the write control signal WS1 is made active, the transistors Q14 and Q24 of the sense amplifier SA10 are turned on, so that the fully amplified levels on the common bit lines GBL1 and GBL2 are transmitted to the respective bit lines BL11 and BL12 and re-written in the memory cell C11 which is continuously selected by the word line WL11.

In this embodiment, it becomes possible to regulate the on-resistance of the transistor Q16 of the threshold value correction driver during the threshold value correction operation, by setting the level of the threshold value correction drive signal RSB1 lower than the usual H level. This can be realized by a level converter circuit for inverting the read control signal RS1 and converting the H level value into a desired level value. With such construction, it is possible to make the source potentials of the level detecting transistors Q11 and Q12 higher than the ground level and to finely regulate the threshold values of the transistors Q11 and Q12 due to the substrate effect to thereby increase the sense sensitivity.

Figure 3:
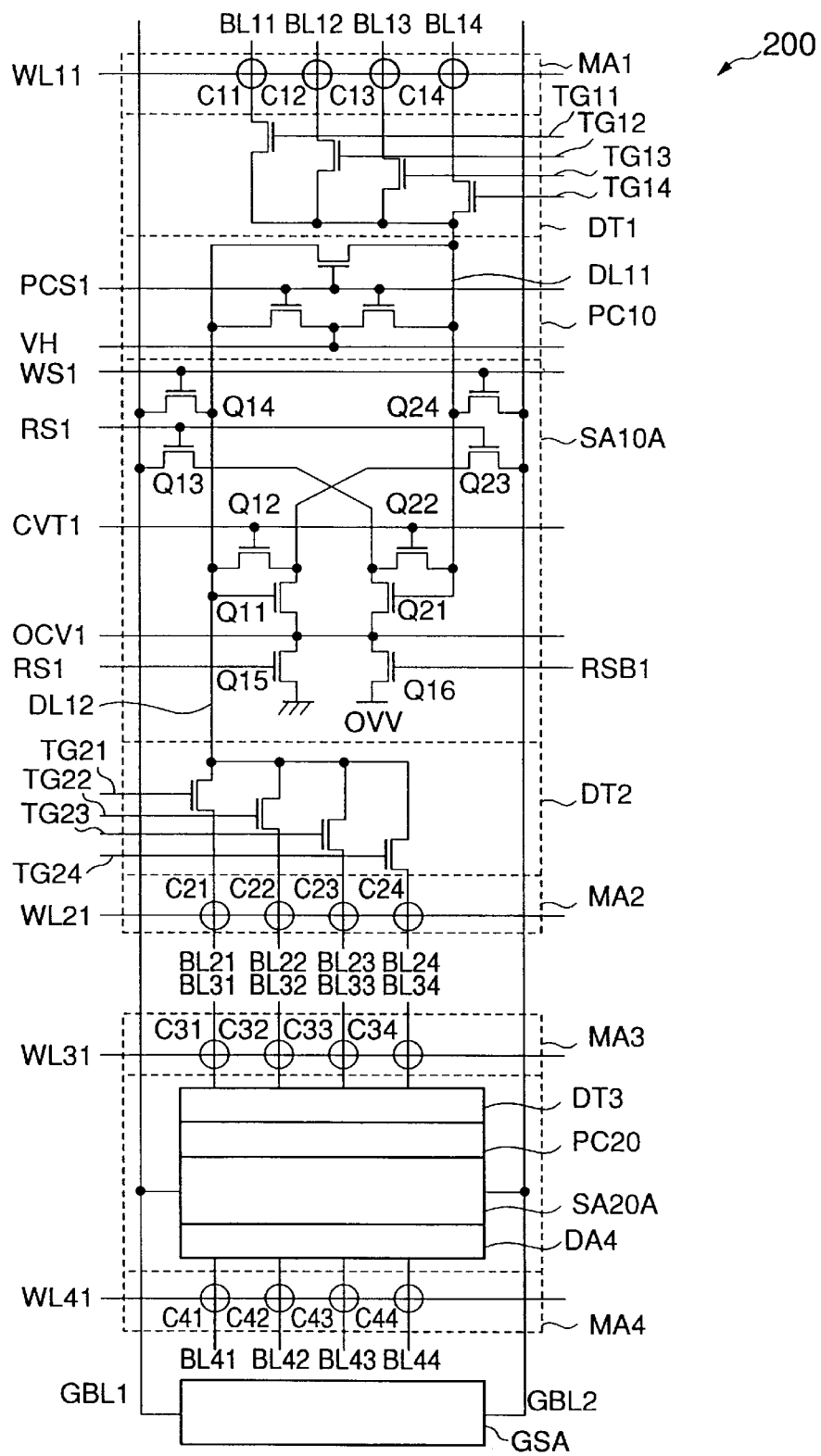
FIG. 3 is a circuit diagram showing a semiconductor memory device 200 according to a second embodiment of the present invention.

A semiconductor memory device 200 according to a second embodiment of the present invention will be described with reference to FIG. 3.

The semiconductor memory device 200 is also integrated in a semiconductor chip. The semiconductor memory device 200 comprises common bit lines GBL1 and GBL2 which are paired and formed in a first layer in parallel to each other with a small gap therebetween and a common sense amplifier GSA connected to the common bit lines GBL1 and GBL2. A signal amplified by the common sense amplifier GSA is output externally of the chip through an output circuit which is not shown.

A plurality of memory cell arrays MA1, MA2, MA3, MA4, are connected to the common bit lines GBL1 and GBL2. The memory cell arrays MA1 and MA2 are paired and the memory cell arrays MA3 and MA4 are paired and precharge circuits PC10, PC20 and sense amplifiers SA10, SA20 are provided correspondingly to the paired memory cell arrays, respectively. Data transfer circuits DT1, DT2, DT3, DT4, are provided for the respective memory cell arrays MA1, MA2, MA3, MA4, . Each of these data transfer circuits is adapted to select one of a plurality of bit lines in each of the memory cell arrays, for example, one of the bit lines BL11, BL12, BL13 and BL14 in the memory cell array MA1, and connect the selected bit line to a data line, in this case, a data line DL11. Therefore, in the memory cell array MA1, for example, a plurality of memory cells C11, C12, C13 and C14 are selected simultaneously when the word line WL11 is activated and only one of information read out from these memory cells is transmitted to the data line DL11.

The precharge circuit PC10 responds to a precharge control signal PCS1 to precharge corresponding paired data lines DL1 and DL2 to a precharge voltage VH. Similarly, the precharge circuit PC20 responds to a precharge control signal PCS2 which is not shown to precharge corresponding paired data lines DL21 and DL22 to the precharge voltage VH, respectively.

A construction of the precharge circuit PC is the same as that of the semiconductor memory device 100 and details thereof are omitted.

The sense amplifier SA10 is connected to the paired data lines DL11 and DL12, detects a potential difference between the data lines DL11 and DL12 by level detecting transistors Q11 and Q21 and amplifies the potential difference. In response to a read control signal RS1, the amplified potential difference is transmitted to the common bit lines GBL2 and GBL1, respectively, and further amplified by the common sense amplifier GSA. The potential difference which is further amplified by the common sense amplifier GSA is returned to the paired data lines DL11 and DL12 in response to a write control signal WS1 and re-written therein. This is similar for the sense amplifier SA20.

The sense amplifier SA10 includes a mechanism for compensating for a difference between a threshold value of the detecting transistor Q11 and a threshold value of the detecting transistor Q21. Necessarily, the sense amplifier SA20 includes a similar mechanism.

Since a construction of the sense amplifier SA10 is the same as that of the semiconductor memory device 100, details thereof are omitted.

Figure 4:
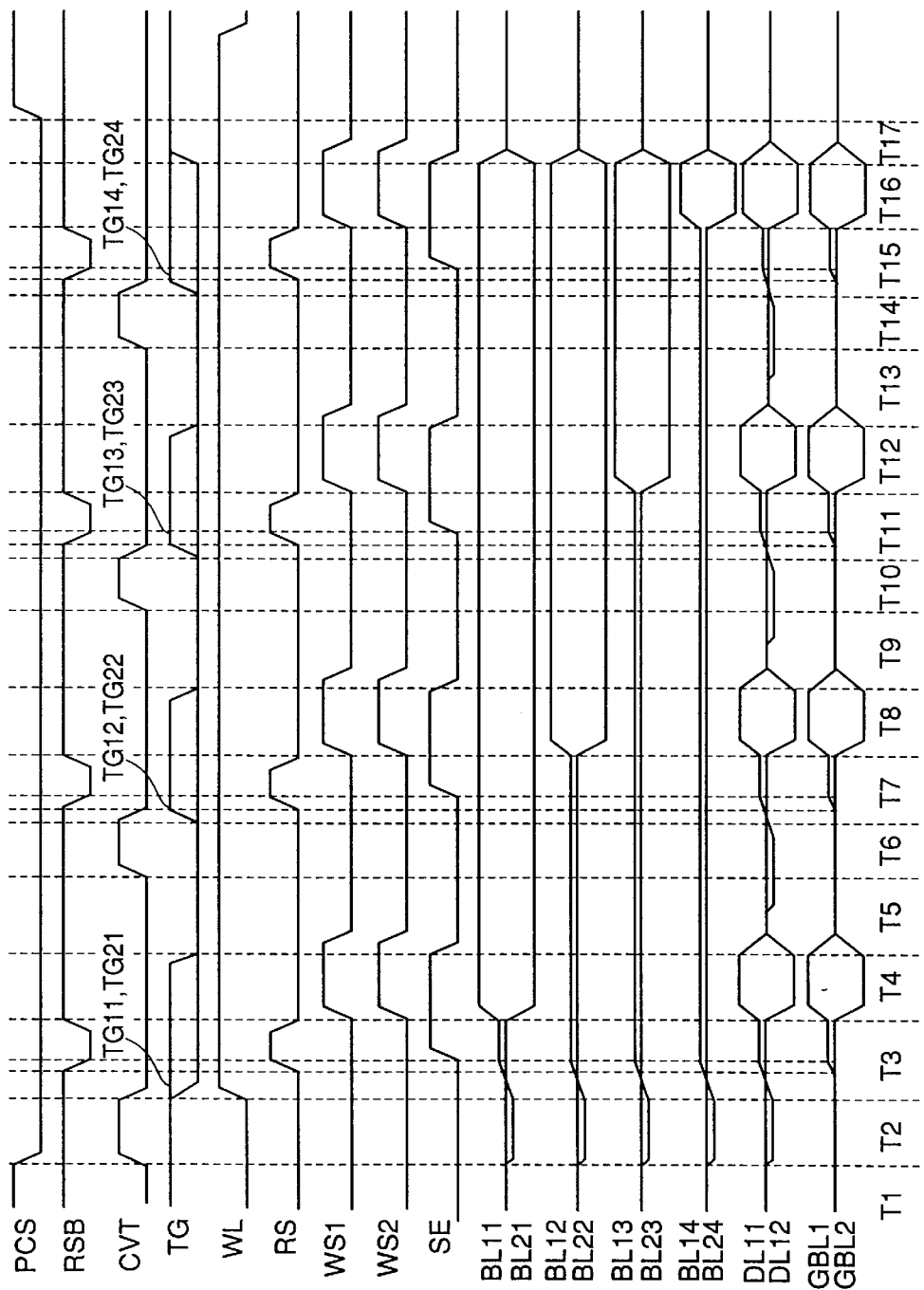
FIG. 4 is a time chart useful in understanding an operation of the semiconductor memory device 200.
Figure 5:
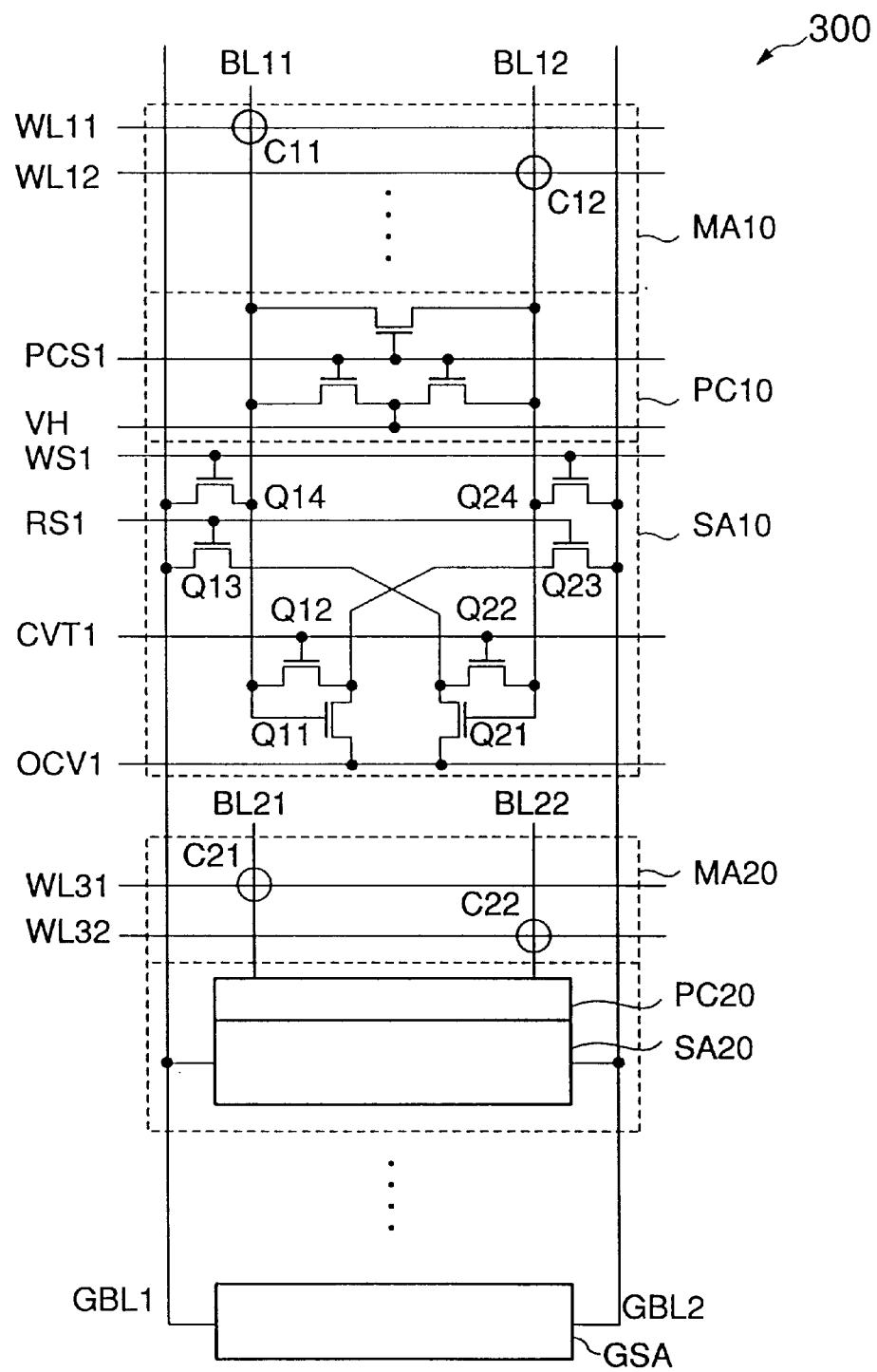
FIG. 5 is a circuit diagram showing a conventional semiconductor memory device 300.
Figure 6:
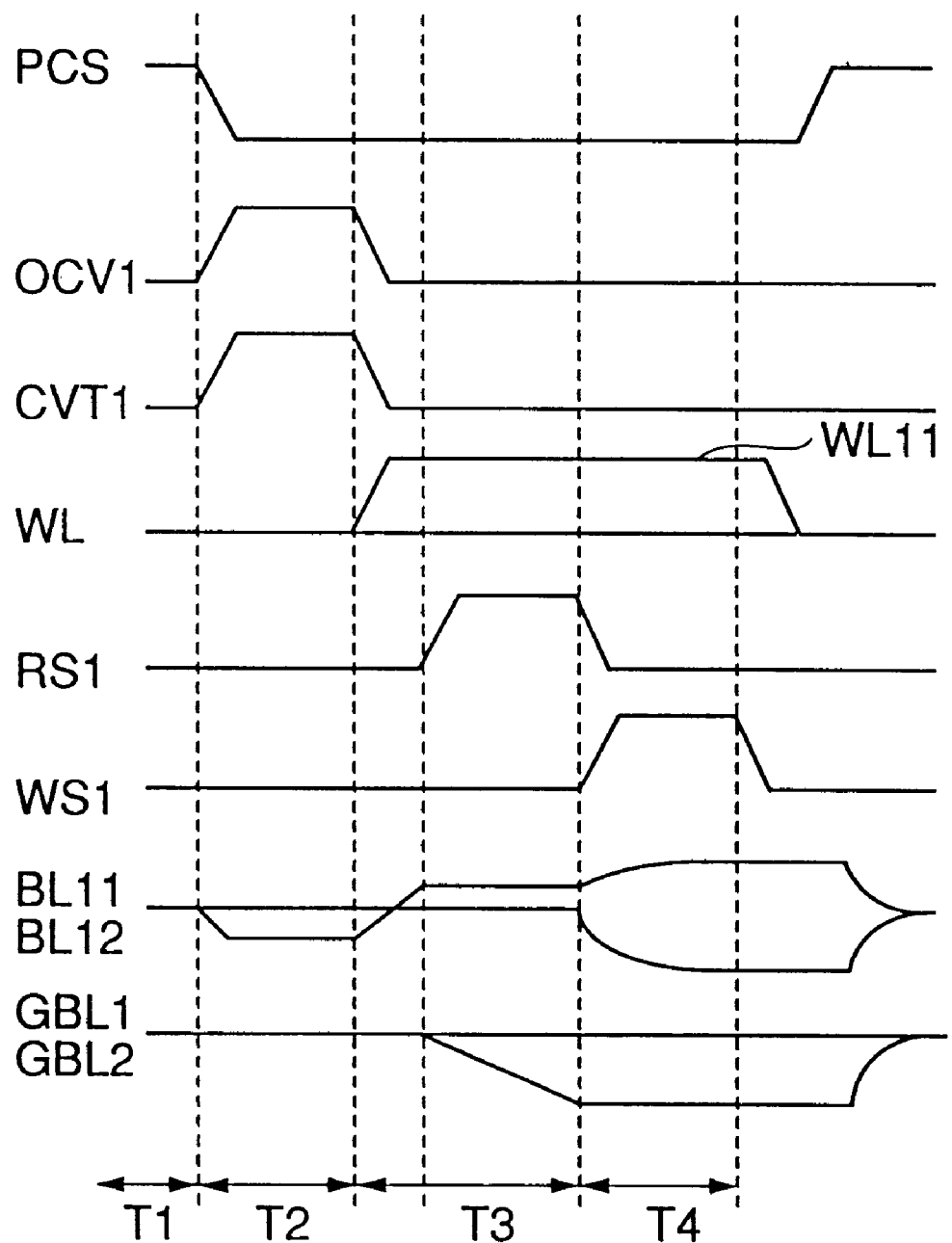
FIG. 6 is a time chart useful in understanding an operation of the conventional semiconductor memory device 300.
Figure 7:
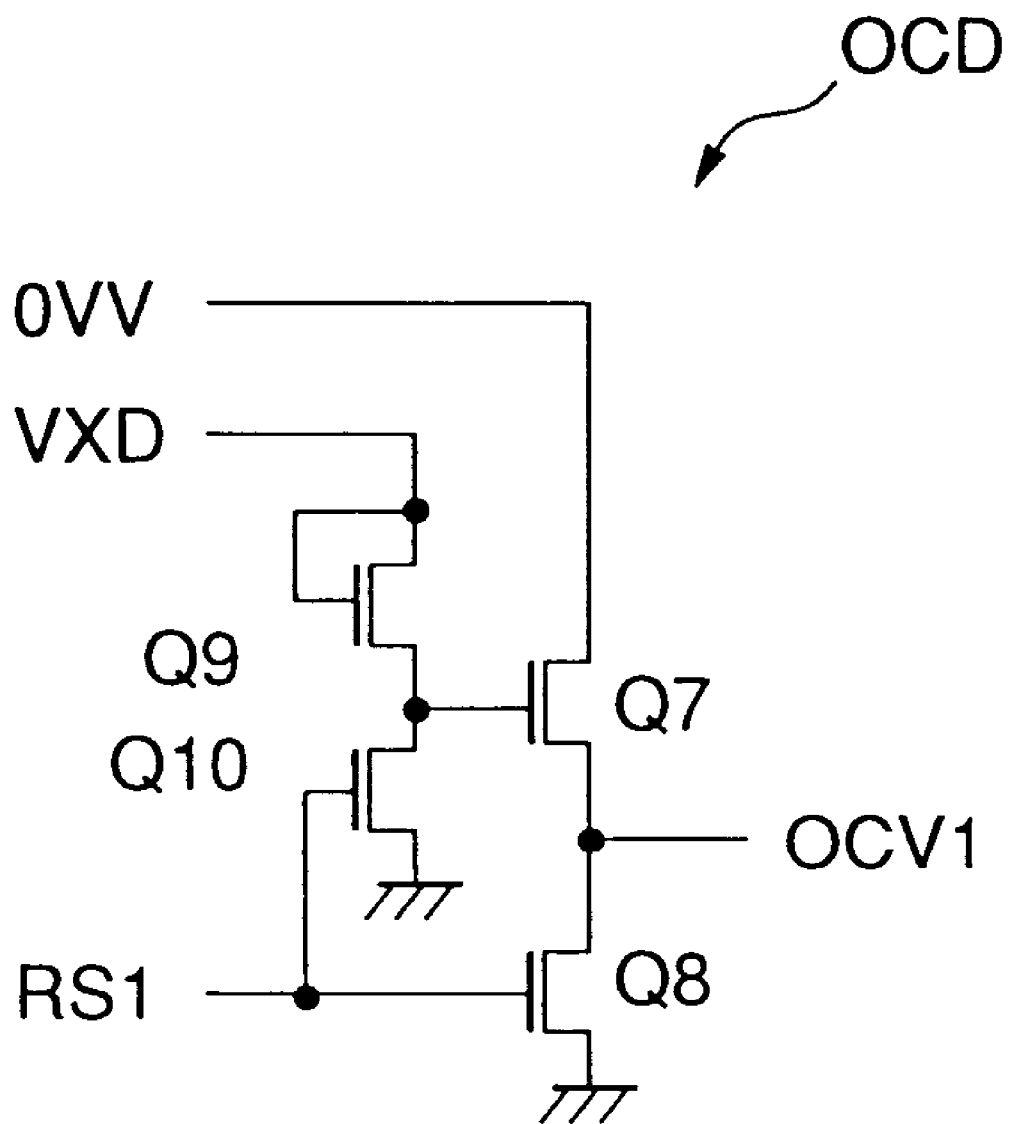
FIG. 7 is a circuit diagram showing an example of a driver circuit used in the semiconductor memory device 300.

Now, an operation of the semiconductor memory device 200 will be described with reference to a time chart shown in FIG. 4. As in the semiconductor memory device 100, the operation of the semiconductor memory device 200 for one cycle can be roughly divided to a precharge period T1, a threshold value correcting period T2, a read period T3 and a re-write period T4.

In the precharge period T1, bit lines BL1 BL14, BL21 BL24, BL31 BL34 and BL41 BL44 of the respective memory cell arrays MA1, MA2, MA3 and MA4 are connected to the corresponding data lines DL11, DL12, DL21 and DL22 by the data transfer circuits DT1, DT2, DT3 and DT4, respectively. The precharge signal PCS is set to an active level and the precharge circuits PC10 and PC20 respond to the active level of the precharge signal PCS to precharge these data lines and the bit lines to the predetermined precharge voltage VH.

In the following description, the operation of the semiconductor memory device 100 related to the memory cell array MA1 and MA2, the precharge circuit PC10, the sense amplifier SA10 and the data transfer circuits DT1 and DT2 will be described for convenience of description unless otherwise defined.

Then, in the threshold value correcting period T2, the precharge control signal PCS1 is made inactive to make the precharge circuit PC10 inactive and, then, a threshold value correction control signal CVT1 is set to an active level. In response to the change of the threshold value correction control signal CVT1 to the active level, the transistors Q12 and Q22 are turned on to diode-connect the transistors Q11 and Q21. At this time, the threshold value correction drive signal RSB1 is a H level. In response to the H level of the threshold value correction drive signal RSB1, the threshold value correcting transistor Q16 of the sense amplifier SA10 is turned on and supplies the threshold value correction voltage OVV to the sources of the transistors Q11 and Q21. Thus, levels of the data lines DL11 and DL12 are corrected to values corresponding to the threshold values of the respective transistors Q11 and Q12.

In the read period T3, the threshold value correction control signal CVT1 is set to an inactive level. Therefore, the transistors Q12 and Q22 are turned off and the diode-connection of the transistors Q12 and Q22 is broken. Further, one of the word lines WL11 WL41, in this embodiment, the word line WL11, is made a selection level to select the memory cells C11 C14 of the memory cell array MA1 and the information held in the memory cells C11 C14 is read out on the bit lines BL11 BL14, respectively. The data transfer circuit DT1 responds to an active level of one of data transfer control signals TG11 TG14, in this case, TG11, to select the corresponding bit line BL11 and connect it to the corresponding data line DL11. The data transfer circuit DT2 responds to an active level of a data transfer control signal TG21 which is paired with the data transfer control signal TG11 to select the corresponding bit line BL21 and connect it to the data line DL21. At this time, since the word line WL21 is not selected, the bit line BL21 of the memory cell array MA2 is necessarily in an inactive level, that is, a precharged level, and, therefore, the data line DL12 is also in a precharged level.

Thereafter, the read control signal RS1 is made in an active level and, in response thereto, the read driver transistor Q15 of the sense amplifier SA10 is turned on to make the transistors Q1 and Q21 operable. Thus, the detecting transistors Q11 and Q21 detect the levels of the selected data line DL11 and the non-selected data line DL12 . On the other hand, the read transistors Q13 and Q23 are turned on to transmit the levels detected by the transistors Q11 and Q21, that is, the levels of the data lines DL11 and DL12, to the common bit lines GBL2 and GBL1, respectively. The common sense amplifier amplifies the potential difference between the common bit lines GBL1 and GBL2 up to the full amplitude and outputs it externally.

In the re-write period T4, the read control signal RS1 is made active to cut the transistors Q13 and Q23 off. When the write control signal WS1 is made active, the transistors Q14 and Q24 of the sense amplifier SA10 are turned on, so that the fully amplified levels on the common bit lines GBL1 and GBL2 are transmitted to the respective data lines DL11 and DL12 and then to the bit lines BL11 and BL12 through the data transfer circuits DT1 and DT2. The level of the bit line BL11 is re-written in the memory cell C11 which is continuously selected by the word line WL11.

Then, in reading data from and re-writing data in the memory cell C12, the data transfer control signals TG11 and TG21 are made inactive to make the data lines DL11 and DL12 , the selected bit lines BL11 and BL21 and the memory cell C11 in data holding states. Thereafter, when a sense amplifier activation signal SE is made inactive, the common sense amplifier GSA precharges the common bit lines GBL1 and GBL2 and the data lines DL11 and DL12 to the precharge voltage VH. Further, the write control signals WS1 and WS2 are made inactive (period T5).

Then, the threshold value correction control signal CVT1 is made active to turn on the correcting transistors Q12 and Q22, to thereby diode-connect the level detecting transistors Q11 and Q21 and correct the levels of the data lines DL11 and DL12 with respect to the threshold voltages of these transistors Q11 and Q21 (period T6). Since the levels of only the data lines DL11 and DL12 are to be corrected, the period T6 for which the threshold value correction control signal CVT1 is in the active level can be shorter than the period T2.

After the threshold value correction operation, the data transfer control signals TG12 and TG22 are made active to connect the bit lines BL12 and BL22 corresponding to the next memory cell C12 of the memory cells C11 to C14 connected to the selected word line WL11, which is not read out as yet, to the data lines DL11 and DL12 and read the data of the memory cell C12, which is preliminarily read on the bit line BL12, on the data line DL11. The transistors Q11 and Q21 detect the levels of the respective data lines DL11 and DL12. On the other hand, since the memory cell C22 of the memory cell array MA2, which corresponds to the selected bit line BL22, is in non-selected state, the bit line BL22 and the data line DL12 are maintained at the precharge level VH which is detected by the transistor Q21. Then, the levels of the data lines DL11 and DL12 are output externally and the data re-write operation for the memory cell C12 is performed through operations similar to those in the periods T3 and T4 (periods T7, T8).

Then, the data read and re-write operations for the memory cells C13 and C14 are performed through operations similar to those in the periods 5 to 8 (periods T9 to T16).

The data read and re-write for all of the memory cells C11 to C14 connected to the selected word line WL11 are performed through the above mentioned series of operations and the data read and re-write operation is ended by making the word line WL11 inactive.

Thus, it is possible to effectively correct the threshold voltages of predetermined transistors before data of a plurality of memory cells connected to a selected word line are read out.

Although the preferred embodiments of the present invention have been described, the present invention is not limited to them and various modifications thereof are possible. For example, the present invention can be applied to other semiconductor memory device than the open bit-line type semiconductor memory device described, for example, a folded bit-line type semiconductor memory device, within the scope of the invention.

As described, since each of the sense amplifiers of the semiconductor memory device according to the present invention comprises the threshold value correction driver which, in response to the threshold value correction drive signal, corrects the levels of the first and second bit lines with respect to the threshold value of the level detecting transistor during the precharge period and the read driver for operating the level detection transistor such that the levels of the respective bit lines during the read period, it is possible to speed-up the threshold value correction and read operation and to realize a semiconductor memory device having a small chip area.

What is claimed is:

1. A semiconductor memory device comprising:
   a common bit line;
   a common sense amplifier coupled to said common bit line to amplify a level thereof;
   a plurality of sub-bit lines each of which is connected to a plurality of memory cells;
   a plurality of switching transistors each connected between said common bit line and an associated one of said sub-bit lines;
   a plurality of level detecting transistors each of which has a gate electrode connected to an associated one of said sub-bit lines;
   a plurality of threshold value correcting transistors each of which is connected between an associated one of said level detecting transistors and a threshold value correction voltage line; and
   a plurality of read driver transistors each of which is connected between an associated one of said level detecting transistors and a reference voltage supply line.

2. The semiconductor memory device as claimed in claim 1, further comprising a plurality of read control signal lines each supplying read control signals to an associated one of said switching transistors, each of said level detecting transistors being turned ON in response to an inactive state of an associate one of said read control signals, each of said threshold value correcting transistors being turned ON in response to an active state of an associate one of said read control signals.

* * * * *